United States Patent
Cook

(10) Patent No.: US 8,653,873 B2
(45) Date of Patent: Feb. 18, 2014

(54) GENERATION OF ADJUSTABLE PHASE REFERENCE WAVEFORM

(75) Inventor: David M. Cook, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 33 days.

(21) Appl. No.: 13/384,723

(22) PCT Filed: Feb. 19, 2010

(86) PCT No.: PCT/US2010/024747
§ 371 (c)(1),
(2), (4) Date: Jan. 18, 2012

(87) PCT Pub. No.: WO2011/102838
PCT Pub. Date: Aug. 25, 2011

(65) Prior Publication Data
US 2012/0112811 A1     May 10, 2012

(51) Int. Cl.
*H03H 11/16* (2006.01)
*H03K 9/08* (2006.01)

(52) U.S. Cl.
USPC ............... 327/231; 327/175; 327/35; 326/52

(58) Field of Classification Search
USPC ................ 327/175, 231–245, 35; 326/52
See application file for complete search history.

(56) References Cited

U.S. PATENT DOCUMENTS

| | | | |
|---|---|---|---|
| 5,705,955 A | 1/1998 | Freeburg et al. | |
| 6,496,552 B2 * | 12/2002 | Tomofuji et al. | 375/373 |
| 7,038,489 B2 * | 5/2006 | Bal | 326/41 |
| 7,362,152 B2 | 4/2008 | Figoli | |
| 7,376,182 B2 * | 5/2008 | Kris | 375/238 |
| 7,480,155 B2 | 1/2009 | Ronesova et al. | |
| 7,524,108 B2 | 4/2009 | Yoshida et al. | |
| 2007/0002994 A1 | 1/2007 | Kanter et al. | |
| 2008/0111820 A1 | 5/2008 | Chang et al. | |
| 2008/0284368 A1 | 11/2008 | Kim et al. | |
| 2010/0001775 A1 | 1/2010 | Tatewaki | |

FOREIGN PATENT DOCUMENTS

| | | |
|---|---|---|
| EP | 0310960 A2 | 4/1989 |
| JP | 55099818 | 7/1980 |
| JP | 59101925 A * | 6/1984 |
| JP | 359101925 A | 6/1984 |
| JP | 59101925 | 6/1987 |
| WO | WO 2007100334 A1 * | 9/2007 |

OTHER PUBLICATIONS

Analog Devices, Specification entitled "Balanced Modulator/Demodulator AD630", 2004, pp. 1-12, www.analog.com.
Stanford Research Systems, "About Lock-In Amplifiers—Application Note #13", www.thinkSRS.com, (Date Unknown), 9 pages.

* cited by examiner

*Primary Examiner* — Lincoln Donovan
*Assistant Examiner* — Thomas Skibinski

(57) ABSTRACT

One embodiment provides a system for generating a reference waveform. The system can include a first pulse-width modulation (PWM) channel configured to provide a first PWM waveform having a first duty cycle and a first frequency. A second PWM channel is configured to provide a second PWM waveform having a second duty cycle and the first frequency. Combinational logic is configured to combine the first PWM waveform and the second PWM waveform to generate a phase-shifted reference PWM waveform having the first frequency and a phase shift that is based on the first duty cycle and the second duty cycle.

20 Claims, 3 Drawing Sheets

GENERATION OF ADJUSTABLE PHASE REFERENCE WAVEFORM

BACKGROUND

It is sometimes desirable to generate a reference signal having a known frequency and phase shift. For example, phase sensitive detectors, also known as lock-in amplifiers, are utilized for extracting a signal having a known carrier. The phase sensitive detector converts the extracted signal's phase and amplitude to a DC voltage signal or a time-varying low-frequency signal. A phase sensitive detector typically requires a reference signal having the same frequency as the carrier to demodulate and extract the signal.

DETAILED DESCRIPTION

Figure 1:
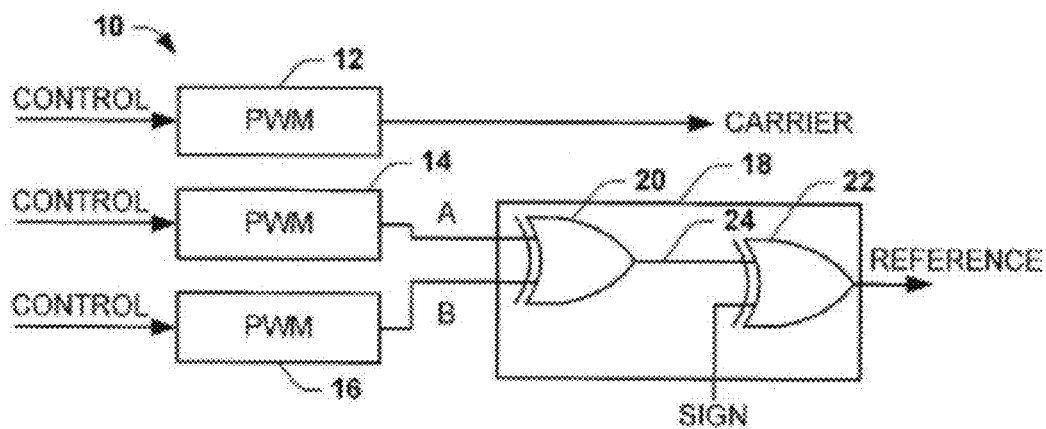
FIG. 1 depicts an example embodiment of a system for generating a reference waveform.

FIG. 1 depicts an example of a system 10 for generating a waveform. As used herein, the term "waveform" is used to refer to a wave that can propagate in a medium, such as an electrically conductive medium, and that can have a fixed or varying form and shape. The system 10 is configured to generate a carrier waveform (CARRIER) and a reference waveform (REFERENCE) having an adjustable phase offset relative to the CARRIER waveform. In the example of FIG. 1, the CARRIER waveform and the REFERENCE waveform each has the same frequency, and the REFERENCE waveform has an adjustable phase shift that can be offset relative to the CARRIER waveform. The CARRIER waveform can be a pulse-width modulation (PWM) waveform, such as generated by PWM channel 12 based on one or more control signal (CONTROL) containing control information. The control information, for example, can set parameters utilized to generate the CARRIER waveform, which parameters can include a value of a duty register and/or a value of a period register. The system 10 also includes additional PWM channels 14 and 16. Each of the channels 14 and 16 can include similar CONTROL signals for controlling the parameters (e.g., period and duty cycle) of the output PWM waveforms, indicated at A and B, respectively. Each of the PWM output waveforms, including the CARRIER waveform and waveforms A and B, can have the same frequency. The waveforms A and B can have different duty cycles that vary based upon the waveform parameters contained, in the CONTROL signals. The CONTROL signals (and/or duty registers) associated with PWM channels 14 and 16 can correspond to duty adjustors for adjusting the PWM waveforms A and B. The CONTROL signals for each PWM channel 12, 14 and 16 can also include a clock signal for specifying a minimum time base that can be utilized to clock each module.

By way of further example, each of the PWM channels 12, 14, and 16 can correspond to a PWM channel implemented by one or more PWM modules within a microprocessor. For instance, a typical microprocessor can have any number of PWM channels, such as 4, 8, 16 or the like. Each of the PWM channels 12, 14, and 16 can operate at the same frequency to produce the corresponding PWM waveforms—the CARRIER waveform, waveform A and waveform B. The CONTROL signals to the PWM channels 14 and 16 each can be provided to provide the same fixed frequency, and, to adjust the duty cycle for each of the respective waveforms A and B. As used herein, the term "duty" corresponds to a time during a given PWM waveform period in which a waveform is asserted high, such as an on-time. The duty cycle thus corresponds to the ratio of on-time and period for a given waveform. Thus, the duty cycle for a given PWM waveform can be controlled by adjusting the duty and/or the period of the given waveform. Those skilled in the art will appreciate various mechanisms that can be utilized to control the duty cycle of each waveform based on what is disclosed herein.

In the example of FIG. 1, the PWM channels 14 and 16 provide the waveforms A and B to combinational logic 18 that is configured to generate the REFERENCE PWM waveform. The combinational logic 18 can include one or more Exclusive-OR (X-OR) gates 20 and 22. The X-OR gate 20 X-ORs the waveforms A and B to provide a corresponding output waveform at 24. The output waveform 24 is provided with the same frequency as the CARRIER waveform, although having a variable phase offset relative to the CARRIER waveform. The output waveform 24 can be provided as the REFERENCE waveform. The phase offset of the output waveform 24 can be controlled based on the duty cycle defined for each of the waveforms A and B. As an example, the duty of the waveforms A and B can be adjusted over an available range, such as from zero up to the period of the waveform.

Over a range of duty values for waveforms A and B, the phase offset of the output 24 can vary one-half period (e.g., 180 degrees). The output 24 of the waveform can also be inverted to achieve an additional range of adjustment. For example, the combinational logic 18 can include the X-OR gate 22 for selectively inverting the output 24 based on a SIGN input. By selecting the SIGN input to be a logic 0 (e.g., low) signal or a logic 1 (e.g., high) signal, the waveform at the output 24 can either be provided unchanged or be inverted to provide the Reference waveform. That is, if the SIGN input is at logic 0, the output 24 is provided as the Reference waveform and if the SIGN input is at logic 1, the output 24 is inverted. Those skilled in the art will appreciate other means, such as circuitry (e.g., logic gates—inverter), which can be utilized for inverting the output 24 to provide an additional range of adjustment. For instance, PWM implementations may have the ability to invert their outputs (e.g., inverting A or B), such that additional X-OR gate 22 may be omitted in certain embodiments.

As a further example, the duty cycle of waveforms A and B can be set based on an output of a detector (e.g., a demodulator or phase sensitive detector) that outputs a signal based on the REFERENCE WAVEFORM. The duty cycle of waveforms A and B can be set to provide the Reference waveform with a phase offset that substantially matches has a desired phase offset relative to) the phase of another input signal that is provided to the detector. For instance, a controller or other function can cause the PWM channels 14 and 16 to sweep through a range of duty settings until the REFERENCE WAVEFORM has a desired phase offset. Such calibration or adjustment to the phase of the REFERENCE WAVEFORM can be performed as part of a start up process and/or dynamically performed during operation.

Figure 2:
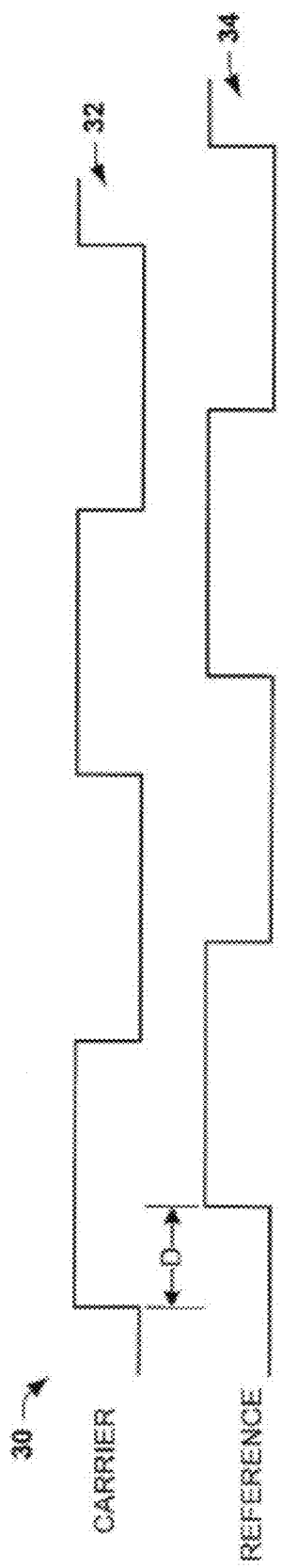
FIG. 2 is a timing diagram depicting example waveforms that can be generated by the system of FIG. 1.

FIG. 2 is a timing diagram 30 depicting an example of a carrier waveform 32 and a reference waveform 34, such as can be generated by the system 10 of FIG. 1. The phase offset between the reference waveform 34 and the carrier waveform 32 is indicated at D. The phase offset D is functionally related to the difference in duty cycle between PWM waveforms A and B of FIG. 1. The phase offset D can be increased, corresponding to an increase in lag between the reference waveform 34 and carrier waveform 32, such as by increasing the duty cycle of each of the waveforms A and B (FIG. 1). Alternatively, the value of D can be decreased relative to that shown in the example of FIG. 2, such as by decreasing the duty cycle of each of the PWM waveforms A and B (FIG. 1).

Figure 3:
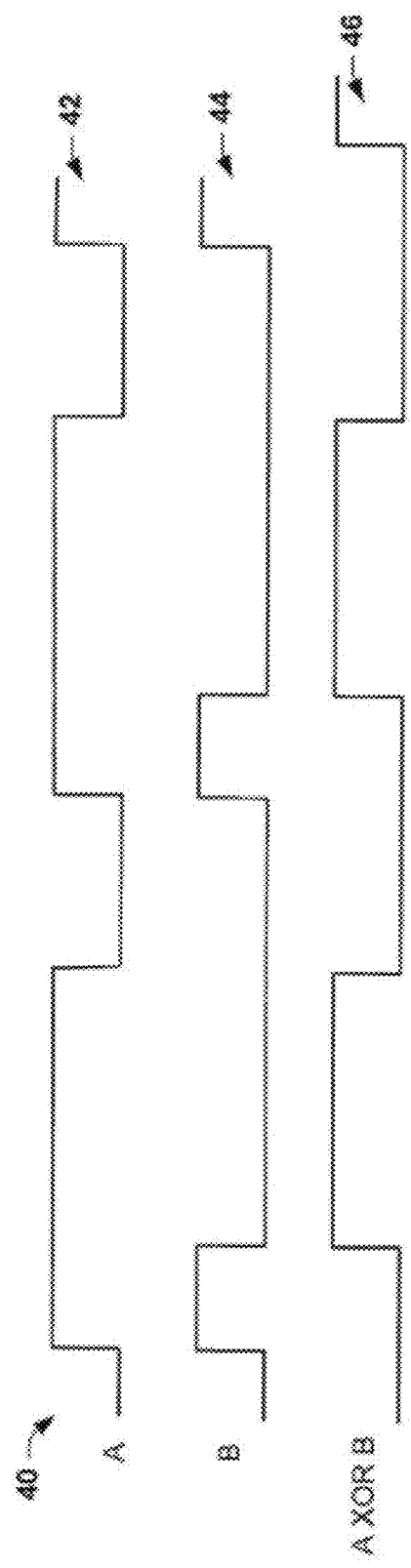
FIG. 3 is a timing diagram depicting example waveforms from the system of FIG. 1 demonstrating generation of an embodiment of a reference waveform.

FIG. 3 depicts an example of another additional timing diagram 40 that depicts examples of the waveform A at 42, waveform B at 44 and the reference waveform at 46, which results from the X-ORing the waveforms A and B. In the example of FIG. 3, the waveform A has a large duty and the waveform B has a small duty by comparison. The X-ORing operation results in the reference waveform 46 being produced with a fifty percent duty cycle and a phase shift that depends on the relative duty of waveforms A and B 42 and 44, respectively. The amount of increase or decrease in the duty of the waveforms A and B 42 and 44 can be the same for each of the waveforms to ensure a constant (e.g., 50%) duty cycle for the reference waveform 46.

Figure 4:
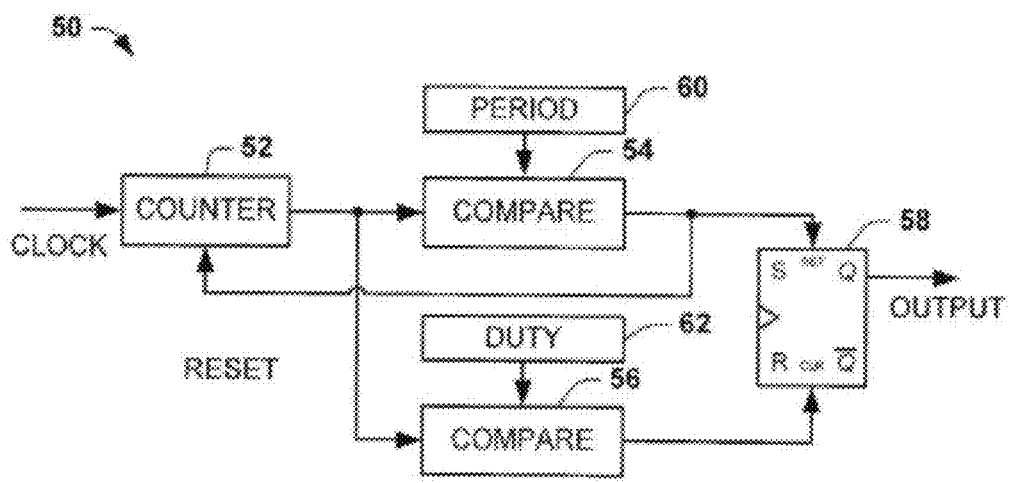
FIG. 4 is an example embodiment of a pulse width modulation (PWM) system that can be utilized to generate waveforms.

FIG. 4 depicts an example of a PWM module 50 that can be implemented in a microprocessor to provide a PWM waveform, such as for each of a plurality of PWM channels. The PWM module 50 includes a counter 52 that is configured to increment or decrement a count value in response to a CLOCK signal. The CLOCK signal can be generated by a system clock within the microprocessor. For example, the clock can operate at 100 $MH_z$ (or higher or lower) such that the counter is set to increment or decrement in response to each period of the clock signal (e.g., a rising edge or falling edge thereof). The counter 52 provides a counter output signal to comparators 54 and 56.

Each of the comparators 54 and 56 also receives a respective value that is compared relative to the counter output value to provide an output signal that is asserted when the counter value equals the respective input value. For instance, the comparator 54 employs a period register 60 that is set to a value that establishes the period of a resulting PWM OUTPUT signal provided by the PWM module 50. Thus, when the counter 52 provides a counter value that is equal to the value in the period register 60, the comparator 54 asserts its output (e.g., a bit), which is provided to a SET input of a set-reset (SR) flip-flop 58. The output of the comparator 54 is also connected to a reset input of the counter 52 for resetting the counter every period.

The comparator 56 receives as inputs the counter output signal and an input value corresponding to a duty register 62. The duty register 62 is configured to adjust or set to a programmable value to establish the duty for the OUTPUT signal. Thus, the value of duty register can range from zero up to the value set in the period register. The comparator 56 is connected to provide its output to a CLR input of the SR flip-flop 58. The comparator 56 thus asserts its output at the CIA input when the counter value is equal to the value of the duty register 62. By way of example, the period register 60 and the duty register 62 can be programmable multi-bit registers (e.g., 8 bits, 16 bits, 32 bits or the like) that can be set to desired values to in turn control the period and duty cycle of the OUTPUT signal. One or more of the duty register 62, comparator 56 and related control information can correspond to an adjustor or other means for adjusting the duty of the OUTPUT signal.

Additionally, the OUTPUT signal may be provided as the inverted version of the output from the SR flip-flop 58 or as the non-Inverted version (as shown). Thus, by providing circuitry to select between the inverted and non-inverted OUTPUT from the SR flip-flop to provide the PWM waveforms A and B (FIG. 1), the inverting X-OR gate 22 can be omitted in the embodiment of FIG. 1.

Figure 5:
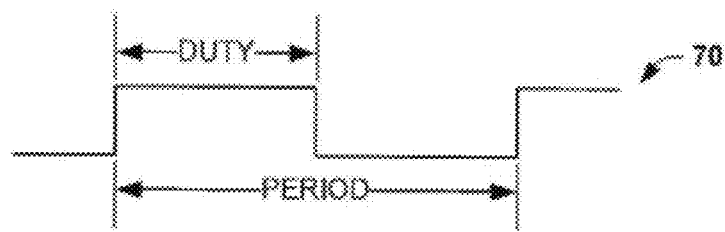
FIG. 5 is an example of a waveform that can be generated by the PWM system of FIG. 4.

FIG. 5 depicts an example of a PWM waveform 70 that can be generated by the PWM module 50 of FIG. 4. As mentioned herein, the duty and period parameters of the PWM waveform 70 can be controlled in the PWM module 50 of FIG. 4, for example, by setting the period register 60 and duty register 62.

Referring between FIGS. 1 and 4, the period register 60 and duty register 62 for PWM channel 12 can be fixed with the duty value being one-half of the period value to provide a fixed frequency and duty cycle for the CARRIER waveform (e.g. 50% duty cycle). Each of the other PWM channels 14 and 16 can have the same period value as the PWM channel 12 as to provide the same frequency, but the duty registers thereof can be adjusted to provide each of the respective waveforms A and B with a corresponding different duty cycle. The duty value for the duty register 62 can be set according to application requirements. For instance, each of the PWM waveforms A and B can begin with a duty that is different relative to each other, and the respective duty registers can be increased (or decreased) by the same amount throughout a calibration process. The amount of increase can be a single (e.g., least significant bit) value or correspond to a step-size change (e.g. multiple bits). Each of the adjustments to the duty registers for generating PWM waveforms A and B can be the same value (up or down), such that the REFERENCE waveform has the same duty cycle as the CARRIER waveform throughout the calibration process. Thus, for example, the REFERENCE waveform can be provided with a fifty percent duty cycle and have the same frequency as the CARRIER waveform, although phase shifted based on the relative duty values set for each of the PWM channels 14 and 16.

Those skilled in the art will understand and appreciate that the PWM module 50 demonstrated in FIG. 4 is one example embodiment of a PWM module. It will be understood and appreciated that PWM waveforms, including a CARRIER waveform and a phase adjustable REFERENCE waveform can be generated by other types of PWM generators, which may be implemented within a microprocessor or external to a microprocessor.

Figure 6:
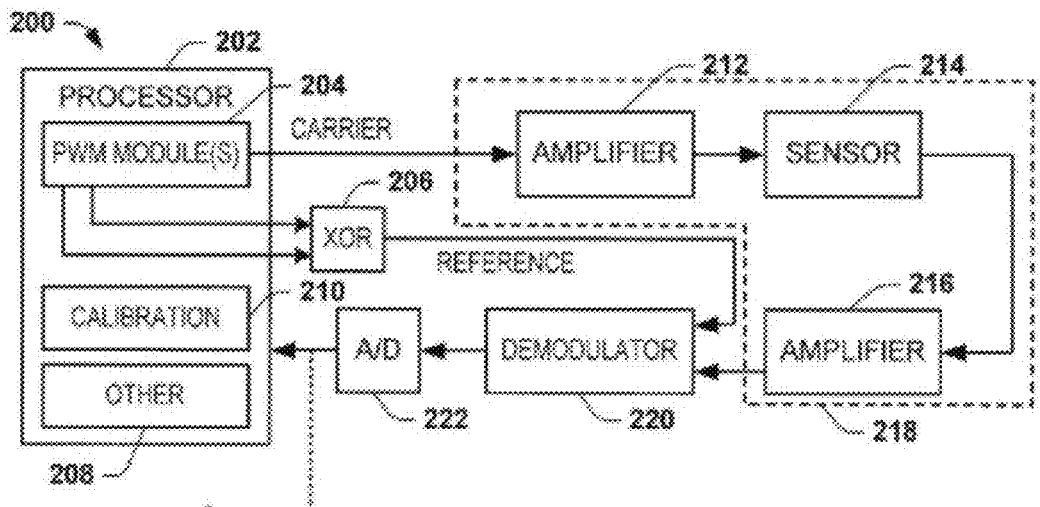
FIG. 6 depicts an example of a sensing system implementing an embodiment of a reference waveform generator.

FIG. 6 depicts an example of a sensor system 200 that can implement a waveform generator such as described herein. The system 200 can be implemented as an embedded system implemented on an integrated circuit or as a combination of discrete components. The sensing system 200 includes a processor 202 that is configured to control operation of the system and to perform operations according to instructions stored in associated memory (e.g., RAM, cache, registers, ROM, or the like). The memory can be internal to the processor 202, external relative to the processor, or the memory can be a combination of internal/external memory depending upon application requirements.

The processor 202 can include one or more PWM modules 204 that provide corresponding PWM waveforms corresponding to each of a plurality of PWM channels. In the example of FIG. 6, three waveforms are depicted as being provided by the PWM module 204. The example waveforms are represented as a CARRIER waveform and waveforms A and B. Waveforms A and B are provided to combinational logic (e.g., including one or more X-OR gates) 206 that combines the PWM waveforms to provide a corresponding demodulation REFERENCE WAVEFORM. The Reference waveform has an adjustable phase offset relative to the CARRIER waveform, such as described herein.

In the example of FIG. 6, the processor 202 can include a variety of other functional modules, indicated at 208, configured to perform corresponding operations. The type and function of such other modules will be apparent to one of ordinary skill in the art and are not pertinent to the example of FIG. 6. One particular method or function that can be implemented by the processor 202 is a calibration function 210. The calibration function 210 can be implemented to set the phase offset of the REFERENCE waveform according to application requirements. The calibration function 210 can correspond to executable instructions stored in memory and executed by the processor 202 for controlling one or more PWM channels of the PWM module 204 to adjust the duty of waveforms A and B. The calibration function 210 can sweep through a range of duty values such that the offset of the REFERENCE waveform varies over a predetermined range of offset, such as from 0 to 180 degrees or from 0 to 360 degrees of one period. The processor 202 or other circuitry (not shown) can determine a desired amount of phase offset for the REFERENCE waveform, such as can be set to maximize the signal to noise ratio (SNR) of a signal generated by the associated circuitry. Alternatively, the REFERENCE waveform can be provided to maintain an associated signal to within a desired voltage range (e.g., to avoid saturation of subsequent processing circuitry).

In the example of FIG. 6, the processor 202 provides the CARRIER waveform to an amplifier 212. The amplifier 212 is configured to amplify the CARRIER to an amplified level for use in performing a corresponding sensing operation. The amplified CARRIER is provided to a sensor 214 that is configured to sense a condition or an event. Those skilled in the art will understand various types of sensors that can operate in response to the CARRIER waveform. Examples of suitable sensors include, but are not limited to, electronic, or micro-electro-mechanical systems (MEMS) that are excited by modulation via the CARRIER waveform. Those skilled in the art will understand and appreciate various types of sensors that can be implemented in the system 200.

By way of further example, the sensor 214 can correspond to a MEMS gyroscope (also known as a gyro), such as for an inertial guidance sensor or other applications. For instance, a MEMS gyro consists of one or more proof mass coupled to an inner frame by springs. The inner frame is then coupled to the substrate by another set of springs oriented at 90° to the inner springs. An actuator causes the mass to resonate in response to excitation, such as by the CARRIER waveform at a known frequency. Rotation produces a Coriolis three, which displaces the inner frame against the outer springs. This displacement can be measured as a change in capacitance at the sense fingers and be represented in a corresponding sensor output signal. In this application, the Reference waveform is nominally adjusted to be in phase with the actuator velocity, which is 90 degrees out of phase with the actuator position.

The sensor 214 provides its output signal to an amplifier 216. The amplifier 216 in turn amplifies the sensor signal to provide an amplified sensor signal to an input of a demodulator 220. The demodulation REFERENCE WAVEFORM is provided to another input of the demodulator 220. The demodulator 220 demodulates the amplified sensor signal based on the REFERENCE WAVEFORM.

The demodulator 220 can be implemented as a phase sensitive demodulator or phase sensitive detector (PSD) also known as a lock-in amplifier. For instance, a PSD is a type of circuit that can employ a reference waveform to extract a signal with a known carrier frequency (e.g., corresponding to the CARRIER waveform), such as from a noisy environment. Those skilled in the art will understand various types of PSD devices that can be implemented as the demodulator 220 for providing a corresponding demodulated output signal. For example, the demodulator 220 can be configured with a single PSD to implement a single phase lock-in or it can include a pair of PSDs configured to perform multi-phase lock-in (e.g., that outputs both in-phase and quadrature components).

The demodulated output signal can be converted from an analog domain to a digital domain via an analog-to-digital (A/D) converter 222. The digitized signal can be provided to the processor 202 for subsequent processing. For instance, the processor 202 can be programmed to monitor the digitized output of the demodulator 220 and control the phase offset of the REFERENCE waveform, such as by adjusting duty parameters of the PWM waveforms A and B. Such monitoring and adjustments can be implemented as part of a calibration function 210 implemented by the processor 202. Adjustments can be made to the duty parameters to cause the phase offset of the reference waveform to sweep through a range of available values. Alternatively or additionally, the digitized signal can be provided to other circuitry via a corresponding interface, indicated schematically by dotted line 224.

The circuitry (e.g., amplifier 212, sensor 214 and amplifier 216) between the processor 202 and the demodulator 220 corresponds to processing circuitry 218, which can impose a phase shift on the CARRIER. The phase shift can be due to delays imposed by the circuitry 218, to functional phase shifts due to the sensor, or be due to a combination of delays and sensor function. Those skilled in the art will understand and appreciate that the phase offset of the REFERENCE waveform can be adjusted to correspond to the offset imposed by the processing circuitry 218 so that the demodulation REFERENCE waveform is at the same frequency and same phase as the output of the amplifier 216 (or other circuitry) provided to the demodulator 220. For instance, the duty for each of the waveforms A and B can be set to provide a maximum SNR for the digitized demodulated waveform. In certain situations, however, it may not be desirable to adjust the demodulation REFERENCE to provide a maximum SNR, such as to avoid saturation of subsequent circuitry (e.g., the A/D converter 222) of the demodulated signal.

The approach described herein can afford fine control for the phase offset near the maximum amplitude such as where the demodulation of the signal results in a cosine function. Additionally, the phase offset can be adjusted in real time by adjusting the duty register of the waveforms A and B. The phase adjustment resolution mentioned above thus can correspond to one part in N, where N is the clock frequency (e.g., typically in tens or hundreds of MHz) divided by the carrier frequency (e.g., typically in kHz). Thus, by sweeping through the range of values for each duty register, the phase offset can be incrementally adjusted with a high level of resolution.

Figure 7:
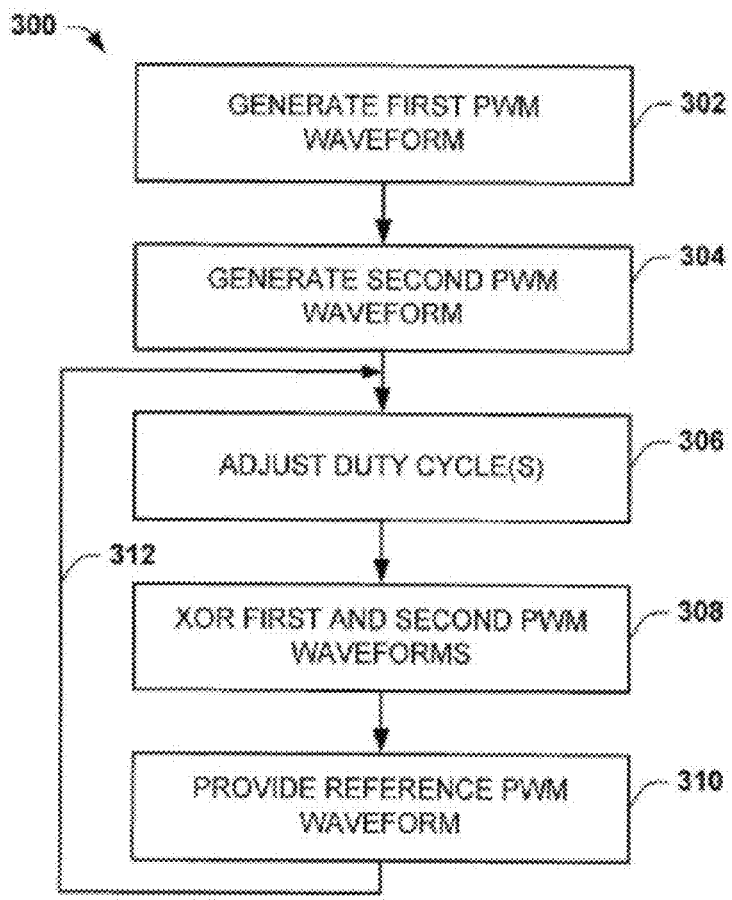
FIG. 7 is a flow diagram depicting an example embodiment of a method for generating a reference waveform.

In view of the foregoing structural and functional features described above, certain methods will be better appreciated with reference to FIG. 7. It is to be understood and appreciated that the illustrated actions, in other embodiments, may occur in different orders and/or concurrently with other actions. Moreover, not all illustrated features may be required to implement a method. It is to be further understood that the following methodology can be implemented in hardware (e.g., a processor, programmable logic, a computer, or a specially designed test system), software (e.g., as executable instructions running on one or more computer, an embedded processor or a specially design test fixture), or any combination of hardware and software.

FIG. 7 is a flow diagram depicting a method 300. The method 300 begins at 302 in which a first PWM waveform is generated. At 304, a second PWM waveform is generated. Each of the waveforms generated at 302 and 304 has an adjustable duty, such as can be adjusted based upon a value stored in respective duty registers. At 306, the duty of each PWM waveform is adjusted. For instance, the duty of each waveform can be adjusted by increasing or decreasing the value of the duty register by a desired step size. The adjustment can be controlled by a processor, computer or other control device. The first and second waveforms are X-ORed together at 308, and a corresponding PWM waveform having an adjustable phase offset is provided at 310. The adjustment at 306 can be repeated (indicated by arrow 312) to adjust the amount of phase offset of the reference waveform that is generated (at 310) relative to a carrier waveform having the same frequency.

What have been described above are example embodiments. It is, of course, not possible to describe every conceivable embodiment of the invention, but one of ordinary skill in the art will recognize that other embodiments are possible. Accordingly, this disclosure is intended to embrace all embodiments, such as including alterations, modifications, and variations that fall within the scope of the appended claims.

What is claimed is:

1. A system comprising:
   a first pulse-width modulation (PWM) channel configured to provide a first PWM waveform having a first duty cycle and a first frequency;
   a second PWM channel configured to provide a second PWM waveform having a second duty cycle and the first frequency;
   combinational logic configured to combine the first PWM waveform and the second PWM waveform to generate a phase-shifted reference PWM waveform having the first frequency and a phase shift that is based on the first duty cycle and the second duty cycle and being relative to a carrier PWM waveform having a fixed duty cycle and the first frequency; and
   a phase sensitive demodulator to demodulate an output signal based on the phase-shifted reference PWM waveform and to provide a corresponding demodulated output signal, the output signal being modulated by the carrier PWM waveform and having the frequency of the carrier PWM waveform.

2. The system of claim 1, wherein the combinational logic comprises at least one exclusive-OR gate configured to provide the phase-shifted reference PWM waveform based on the first PWM waveform and the second PWM waveform.

3. The system of claim 1, wherein the combinational logic comprises an inverter configured to increase an adjustable range for the phase shift.

4. The system of claim 3, wherein the inverter comprises a second exclusive-OR gate, the second exclusive-OR gate being configured to invert the phase-shifted reference PWM waveform based on a sign input set to one of invert or not invert the phase-shifted reference PWM waveform.

5. The system of claim 1, further comprising a third PWM channel configured to provide the carrier PWM waveform, wherein the phase-shifted reference PWM waveform also having the fixed duty cycle.

6. The system of claim 5, wherein each of the first PWM channel, the second PWM channel and the third PWM channel correspond to PWM channels in a microprocessor.

7. The system of claim 6, further comprising:
   circuitry that is excited in response to the carrier PWM waveform and is configured to provide the output signal at the frequency of the carrier PWM waveform.

8. The system of claim 7, wherein the phase shift of the phase-shifted reference PWM waveform is set according to a phase difference between the carrier PWM waveform and the output signal.

9. The system of claim 7, wherein the circuitry comprises a micro-electrical-mechanical system.

10. The system of claim 1, further comprising:
    a first duty adjustor configured to adjust the first duty cycle of the first PWM waveform; and
    a second duty adjustor configured to adjust the second duty cycle of the second PWM waveform.

11. The system of claim 10, wherein each of the first duty adjustor and the second duty adjustor comprises a respective duty register configured to store a programmable value that sets the duty cycle for each of the first PWM waveform and the second PWM waveform.

12. The system of claim 1, wherein the phase sensitive demodulator is a single phase sensitive demodulator to implement a single phase lock-in.

13. The system of claim 1, wherein the phase sensitive demodulator comprises a pair of phase sensitive demodulators to implement a multi-phase lock-in to output both in-phase and quadrature components.

14. The system of claim 1, further comprising a calibration function for controlling at least one of a first and a second PWM to sweep through a range of duty values to vary the offset of the output waveform.

15. The system of claim 14, further comprising a signal generator to determine a maximized signal to noise ratio.

16. The system of claim 9, wherein the micro-electrical-mechanical system comprises a gyroscope sensor.

17. A method for generating a reference waveform comprising:
    generating a first pulse-width modulation (PWM) waveform having a first frequency;
    generating a second PWM waveform having the first frequency;
    generating a carrier waveform having a fixed duty cycle and the first frequency;
    exclusive-ORing the first PWM waveform and the second PWM waveform to provide the reference waveform, the reference waveform having a phase shift relative to the carrier waveform that is adjustable based on a duty cycle of the first PWM waveform and the second PWM waveform;
    demodulating an output signal that is modulated by the carrier waveform; and
    providing a corresponding demodulated output signal.

18. The method of claim 17, further comprising adjusting the duty cycle of the first PWM waveform and the second PWM waveform to adjust the phase shift of the reference waveform.

19. The method of claim 17, wherein each of the first PWM waveform and the second PWM waveform is generated by a PWM module in a microprocessor, the method further comprising setting the duty cycle for each of the first PWM waveform and the second PWM waveform by programming a duty value in respective duty registers.

20. The system of claim 17, wherein the carrier waveform is generated by a PWM module in a microprocessor.

* * * * *